Jan. 2, 1962 R. G. SCHAYES ET AL 3,015,780

TRANSISTOR CLASS-B BIASING CIRCUITS

Filed Feb. 16, 1955

INVENTORS
RAYMOND GEORGES SCHAYES
JOHANNES ENSINK

BY Fred M. Vogel
AGENT

United States Patent Office 3,015,780

Patented Jan. 2, 1962

3,015,780

TRANSISTOR CLASS-B BIASING CIRCUITS

Raymond Georges Schayes, Forest-Brussel, Belgium, and Johannes Ensink, Hilversum, Netherlands, assignors, by mesne assignments, to North American Philips Company, Inc., New York, N. Y., a corporation of Delaware Filed Feb. 16, 1955, Ser. No. 488,607

Claims priority, application Netherlands Feb. 16, 1954

4 Claims. (Cl. 330—14)

The present invention relates to push-pull amplifier circuits. More particularly, the invention relates to a push-pull amplifier comprising transistors connected for class AB, B or C operation; i.e. the transistors are adjusted in a manner such that a signal oscillation exceeds the cut-off voltage of the transistors for part of its period.

In a conventional circuit arrangement of this kind the signal to be amplified may be supplied to the transistors through a push-pull transformer. Such a push-pull transformer, however, is comparatively costly, so that the signal is preferably supplied via separating capacitors to the transistors. In this case, however, the problem arises that, due to rectification in the input circuits of the transistors, a direct voltage is produced across the said separating capacitors, this voltage affecting adversely the adjustment of the transistors.

An object of the present invention is the provision of a solution for this problem. In accordance with the invention the push-pull signal to be amplified is supplied in push-pull through blocking capacitors to the input electrodes of the transistors, and in order to produce the required bias voltage, the input electrodes are connected to rectifiers having a pass direction opposite to the pass direction of the transistor, viewed from the input electrodes concerned.

The invention will now be described with reference to the accompanying drawing, in which.

Figure 1:
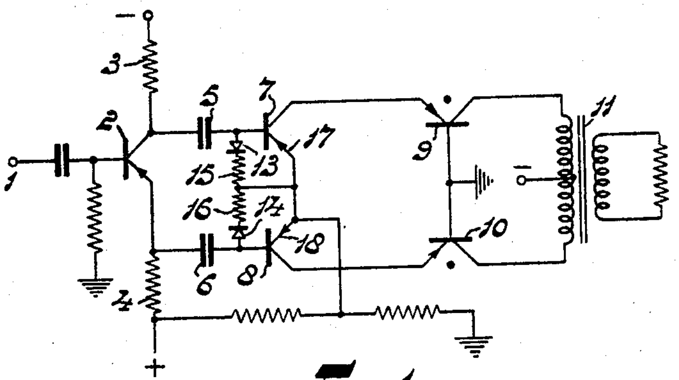
FIG. 1 is a schematic diagram of an embodiment of the amplifier circuit of the present invention.

In FIG. 1, a signal to be amplified is supplied through a terminal 1 to a transistor 2, having equal collector- and emitter-resistances 3 and 4 respectively, across which, consequently, push-pull voltages are produced. These voltages are supplied through blocking capacitors 5 and 6 respectively to input electrodes, namely to the base electrodes, of transistors 7 and 8 respectively. The amplified signal produced in the collector circuits of the transistors 7 and 8 is again amplified with the aid of push-pull transistors 9 and 10 and supplied to an output transformer 11.

Due to base-emitter rectification of the transistors 7 and 8, however, if no precautions are taken, the capacitors 5 and 6 would be charged to a voltage, at which the signal could hardly exceed the blocking voltage of the transistors 7 and 8. In order to permit the required adjustment of the transistors 7 and 8, their respective base electrodes are connected to rectifiers 13 and 14. The pass directions of the rectifiers 13 and 14 viewed from these base electrodes, are opposite to those of the transistors 7 and 8 respectively. Therefore, the direct voltages produced by base-emitter rectification in one phase of the signal oscillation will flow away across the capacitors 5 and 6 respectively, and in the other phase of the signal oscillation across the rectifiers 13 and 14 respectively.

The circuit arrangement of the present invention is particularly suitable for connection of the transistors 7 and 8 for class B operation, in which, consequently, the bias voltage between the emitter electrode and the base electrode is equal to zero. In this case a direct-voltage supply between these two electrodes must be omitted. If, moreover, the forward resistance of the rectifiers 13 and 14, if necessary by adding series resistors 15 and 16 respectively, is rendered substantially equal to the forward resistances of the base-emitter paths of the transistors 7 and 8 respectively, inclusive of resistors if any in emitter circuits 17 and 18 respectively, this class B connection will be maintained, irrespective of the signal amplitude.

Figure 2:
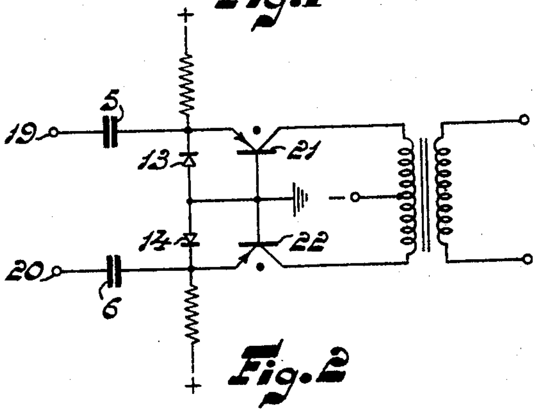
FIG. 2 is a schematic diagram of another embodiment of the amplifier circuit of the present invention.

In FIG. 2, the push-pull signal across terminals 19 and 20 is supplied through separating capacitors 5 and 6 respectively to the emitter electrodes of transistors 21 and 22 respectively. In this case also, the direct voltages produced by base-emitter rectification in the transistors 21 and 22 across the capacitors 5 and 6 can flow away via rectifiers 13 and 14 with opposite pass directions.

Figure 3:
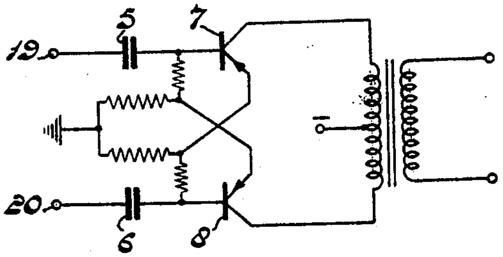
FIG. 3 is a modification of the embodiment of FIG. 1.

FIG. 3 is a modification of the embodiment of the amplifier circuit of FIG. 1. In FIG. 3, the base-emitter path of one transistor 7 operates as the rectifier 14, referred to in FIGS. 1 and 2, for the other transistor 8 and conversely. The push-pull signal across the terminals 19 and 20 will transfer a charge, in one phase, through the rectifying base-emitter path of the transistor 7, from the separating capacitor 6 to the separating capacitor 5. In the opposite phase of this push-pull signal this charge will flow back via the rectifying base-emitter path of the transistor 8, so that the desired transistor connection is maintained.

What is claimed is:

1. A push-pull amplifier comprising first and second transistors each having base, emitter and collector electrodes, first and second capacitors each coupled to a different one of the base electrodes, means for receiving a signal oscillation, a third transistor having base, emitter and collector electrodes, a third capacitor connected between said means and the base electrode of said third transistor, a first resistor connected between the base of said third transistor and a point of ground potential, second and third resistors, means for applying a positive potential to the emitter of said third transistor through said second resistor, means for applying a negative potential to the collector of said third transistor through said third resistor, means for applying the signal oscillation from the output of said third transistor to the base electrode of each of said first and second transistors in push-pull arrangement through said first and second capacitors, circuit means for applying operating voltages to said first and second transistors having values at which the magnitude of said signal oscillation exceeds the cut-off voltage of the first and second transistors for part of its period, first and second rectifier circuits each comprising a rectifier and a resistor connected in series between the base and emitter electrodes of said first and second transistors respectively, each of said rectifiers having a pass direction opposite to that of the corresponding transistor as viewed from the base electrode to which the rectifier is coupled, each of said circuits having a forward resistance substantially equal to the forward resistance of the base-emitter path of the corresponding transistor, each of said first and second capacitors being charged when said first and second transistors are in the conductive state and discharged through said first and second rectifier circuits respectively when the transistors are in the non-conductive state, whereby the base current of each transistor is prevented from charging its associated capacitor excessively and biasing the transistor beyond cutoff, and means connected between the collector electrode of said first and second transistors for deriving an output signal from said first and second transistors.

2. A push-pull amplifier comprising first and second transistors having base, emitter and collector electrodes, first and second capacitors each coupled to a different one of said emitter electrodes, means for applying a signal oscillation to the emitter electrode of each of said transistors in push-pull arrangement through said capacitors, circuit means for applying operating voltages to said transistors having values at which the magnitude of said signal oscillations exceeds the cut-off voltage of the transistors for part of its period, first and second rectifiers each connected between the base and emitter electrodes of a different one of said transistor each of said rectifiers having a pass direction opposite to that of the corresponding transistor as viewed from the emitter electrode to which the rectifier is coupled, said first and second capacitors being charged when said first and second transistors are in the conductive state and discharged through said first and second rectifiers when the transistors are in the nonconductive state, whereby the base current of each transistor is prevented from charging its associated capacitor excessively and biasing the transistor beyond cutoff, and means connected between the collector electrodes of said transistors for deriving an output signal therefrom.

3. A push-pull amplifier comprising first and second transistors each having base, emitter and collector electrodes, first and second capacitors each coupled to a different one of said base electrodes, means for applying a signal oscillation between the base and emitter electrodes of each of said transistors in push-pull arrangement through said capacitors, circuit means for applying operating voltages to said transistors having values at which the magnitude of said signal oscillation exceeds the cut-off voltage of the transistors for part of its period, means for coupling the base electrode of each of said transistors to the emitter electrode of the other of said transistors, the base-emitter path of each of said transistors operating as a rectifier having a pass direction opposite to that of the other transistor as viewed from the base electrode of each of said transistors, each of said capacitors being charged when the transistors are in the conductive state and discharged through one of said base-emitter paths when the transistors are in the nonconductive state, whereby the base current of each transistor is prevented from charging its associated coupling capacitor excessively and biasing the transistor beyond cut-off, and means connected between the collector electrodes of said transistors for deriving an output signal therefrom.

4. A signal amplifier circuit comprising, a transistor having base, emitter and collector electrodes connected and biased to provide class B operation for amplifying an alternating current signal, direct current feedback stabilization means for said transistor, said stabilization means providing a change in bias for said transistor with changes in the amplitude of said alternating current signal, signal responsive means for providing a direct current control signal proportional to said alternating current signal, and means for applying said control signal to the electrodes of said transistor for biasing said emitter electrode in the current conducting direction with respect to said base electrode and to compensate for said change in bias.

References Cited in the file of this patent

UNITED STATES PATENTS

| | | |
|---|---|---|
| 2,269,590 | Lewis et al. | Jan. 13, 1942 |
| 2,339,466 | Duft | Jan. 18, 1944 |
| 2,552,588 | Reeves | May 15, 1951 |
| 2,644,894 | Lo et al. | July 7, 1953 |
| 2,651,685 | Tharp | Sept. 8, 1953 |
| 2,777,905 | Kelly | Jan. 15, 1957 |
| 2,783,314 | Reaves | Feb. 26, 1957 |
| 2,791,644 | Sziklai | May 7, 1957 |
| 2,924,778 | Barton | Feb. 9, 1960 |

OTHER REFERENCES

Shea text: "Principles of Transistor Circuits," page 121, published 1953 by John Wiley & Sons, New York, N.Y.